United States Patent
Oi et al.

(10) Patent No.: US 8,253,236 B2
(45) Date of Patent: Aug. 28, 2012

(54) POWER SEMICONDUCTOR DEVICE

(75) Inventors: Takeshi Oi, Tokyo (JP); Seiji Oka, Tokyo (JP); Yoshiko Obiraki, Tokyo (JP); Osamu Usui, Tokyo (JP); Yasushi Nakayama, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 13/086,499

(22) Filed: Apr. 14, 2011

(65) Prior Publication Data

US 2011/0187003 A1 Aug. 4, 2011

Related U.S. Application Data

(63) Continuation of application No. 12/504,225, filed on Jul. 16, 2009.

(30) Foreign Application Priority Data

Jul. 18, 2008 (JP) .................................. 2008-186603

(51) Int. Cl.
*H01L 23/48* (2006.01)

(52) U.S. Cl. ........ 257/693; 257/697; 257/698; 257/150; 257/177; 257/E23.142

(58) Field of Classification Search .................. 257/697, 257/698, 693, 150, 177, E23.142
See application file for complete search history.

(56) References Cited

U.S. PATENT DOCUMENTS

| | | | |
|---|---|---|---|
| 3,545,080 A | 12/1970 | Evans | |
| 5,721,455 A * | 2/1998 | Takashita | ...................... 257/713 |
| 7,589,412 B2 | 9/2009 | Kashimoto et al. | |
| 7,701,054 B2 | 4/2010 | Stolze et al. | |
| 7,816,781 B2 * | 10/2010 | Thoben et al. | ................. 257/693 |
| 2003/0025256 A1 | 2/2003 | Roick | |
| 2007/0215999 A1 * | 9/2007 | Kashimoto et al. | ........... 257/678 |
| 2010/0013086 A1 | 1/2010 | Obiraki et al. | |
| 2010/0117219 A1 | 5/2010 | Oka et al. | |

(Continued)

FOREIGN PATENT DOCUMENTS

DE 10 2006 051 454 A1 9/2007

(Continued)

OTHER PUBLICATIONS

Office Action mailed Jun. 13, 2011, in co-pending U.S. Appl. No. 12/504,225.

(Continued)

*Primary Examiner* — N Drew Richards
*Assistant Examiner* — Yu-Hsi D Sun
(74) *Attorney, Agent, or Firm* — Oblon, Spivak, McClelland, Maier & Neustadt, L.L.P.

(57) ABSTRACT

A power semiconductor device includes power semiconductor elements joined to wiring patterns of a circuit substrate, cylindrical external terminal communication sections, and wiring means for forming electrical connection between, for example, the power semiconductor elements and the cylindrical external terminal communication sections. The power semiconductor elements, the cylindrical external terminal communication sections, and the wiring means are sealed with transfer molding resin. The cylindrical external terminal communication sections are arranged on the wiring patterns so as to be substantially perpendicular to the wiring patterns, such that external terminals are insertable and connectable to the cylindrical external terminal communication sections, and such that a plurality of cylindrical external terminal communication sections among the cylindrical external terminal communication sections are arranged two-dimensionally on each of wiring patterns that act as main circuits.

5 Claims, 11 Drawing Sheets

U.S. PATENT DOCUMENTS

| | | | |
|---|---|---|---|
| 2010/0127383 A1 | 5/2010 | Oka et al. |
| 2010/0127389 A1 | 5/2010 | Obiraki et al. |
| 2010/0133667 A1 | 6/2010 | Oka et al. |
| 2010/0133681 A1 | 6/2010 | Oka et al. |
| 2010/0133684 A1 | 6/2010 | Oka et al. |
| 2010/0134979 A1 | 6/2010 | Obiraki et al. |

FOREIGN PATENT DOCUMENTS

| | | |
|---|---|---|
| DE | 10 2008 008 141 A1 | 8/2008 |
| DE | 11 2008 000 229 T5 | 12/2009 |
| JP | 8-316357 | 11/1996 |
| JP | 2001-196495 | 7/2001 |
| JP | 2007-184315 | 7/2007 |

OTHER PUBLICATIONS

Office Action mailed Sep. 26, 2011, in co-pending U.S. Appl. No. 12/504,225.

U.S. Appl. No. 13/150,593, filed Jun. 1, 2011, Oka, et al.

German Office Action issued Aug. 29, 2011, in Patent Application No. 10 2009 033 321.5. (with English-language translation).

* cited by examiner

[FIG. 1]
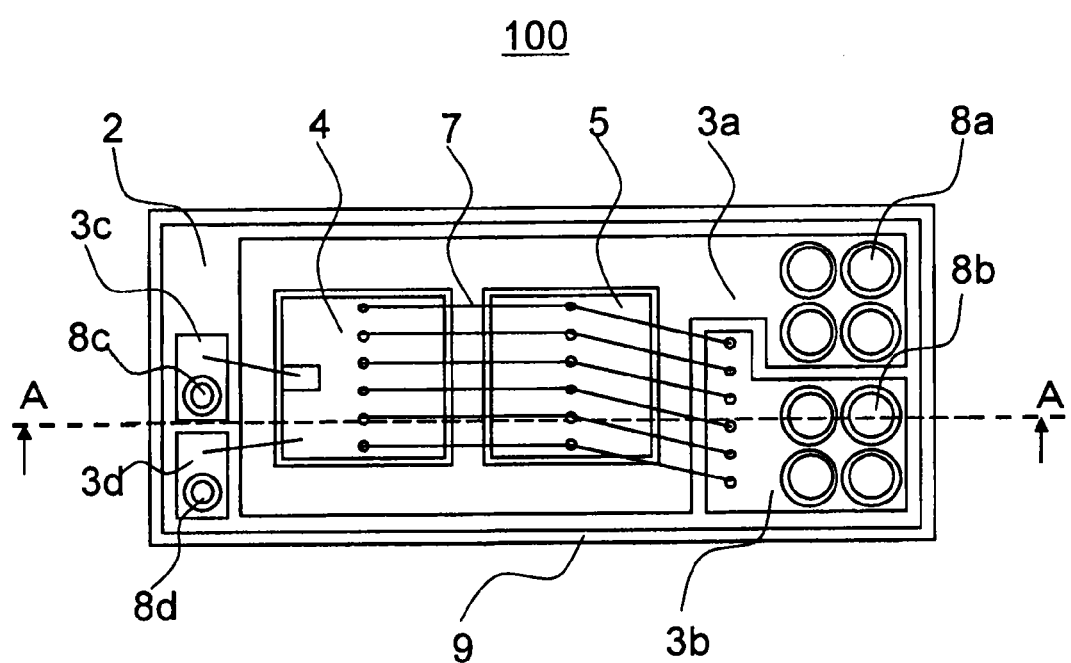

[FIG.2]
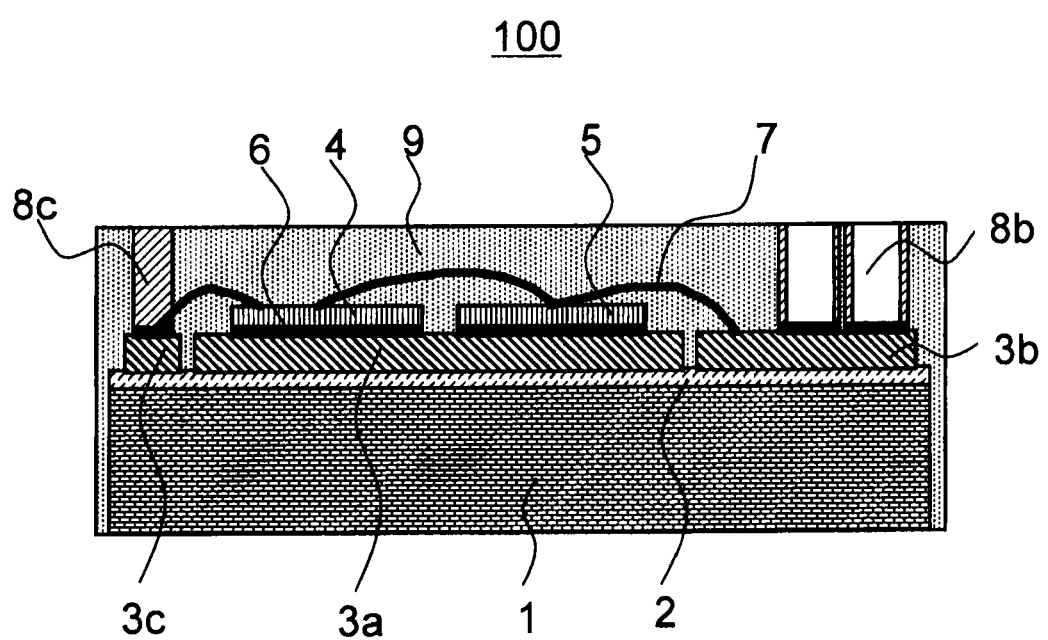

[FIG.3]
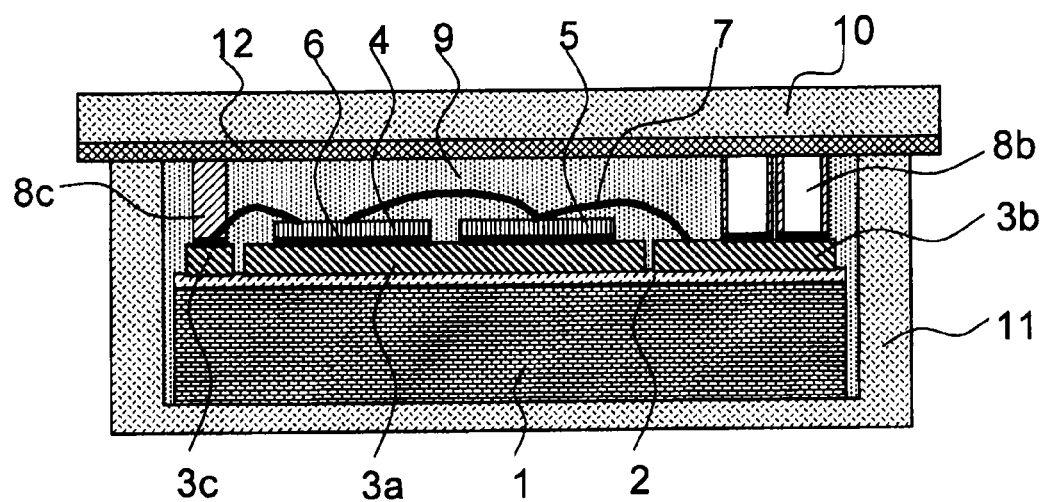

[FIG.4]
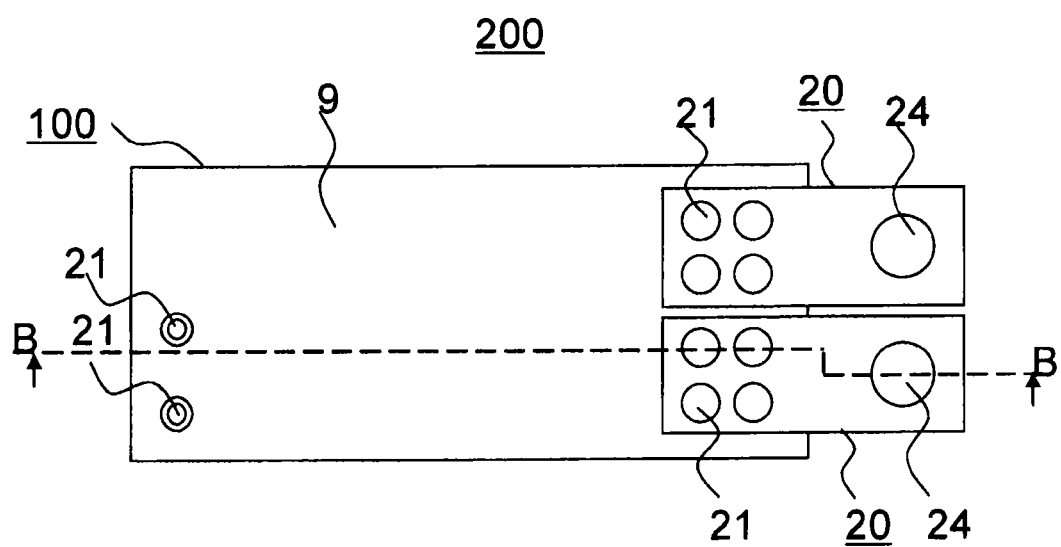

[FIG. 5]
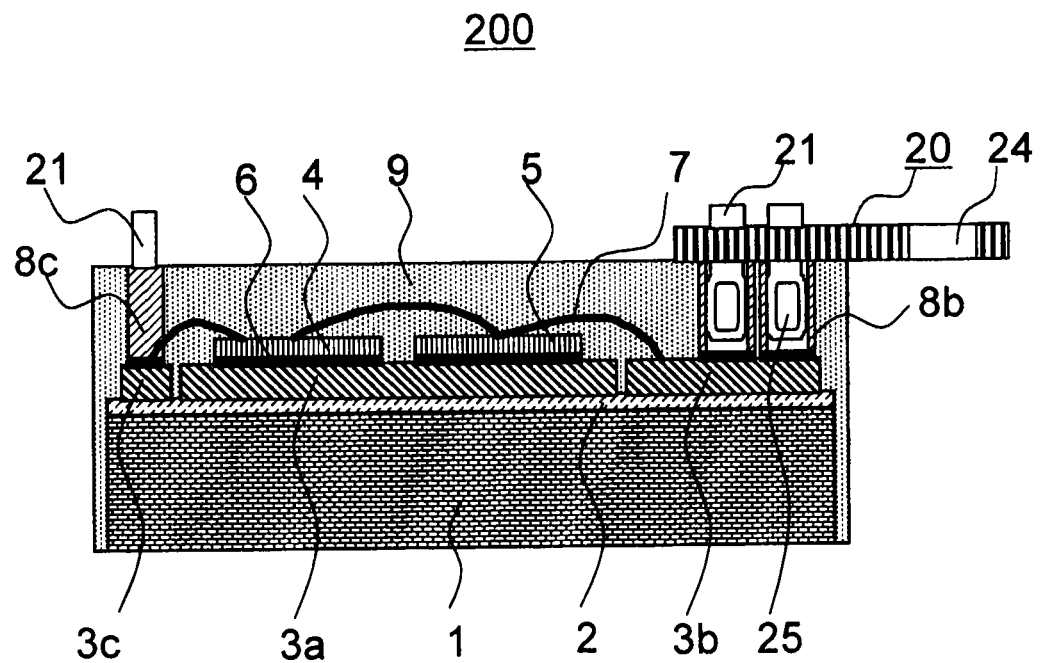

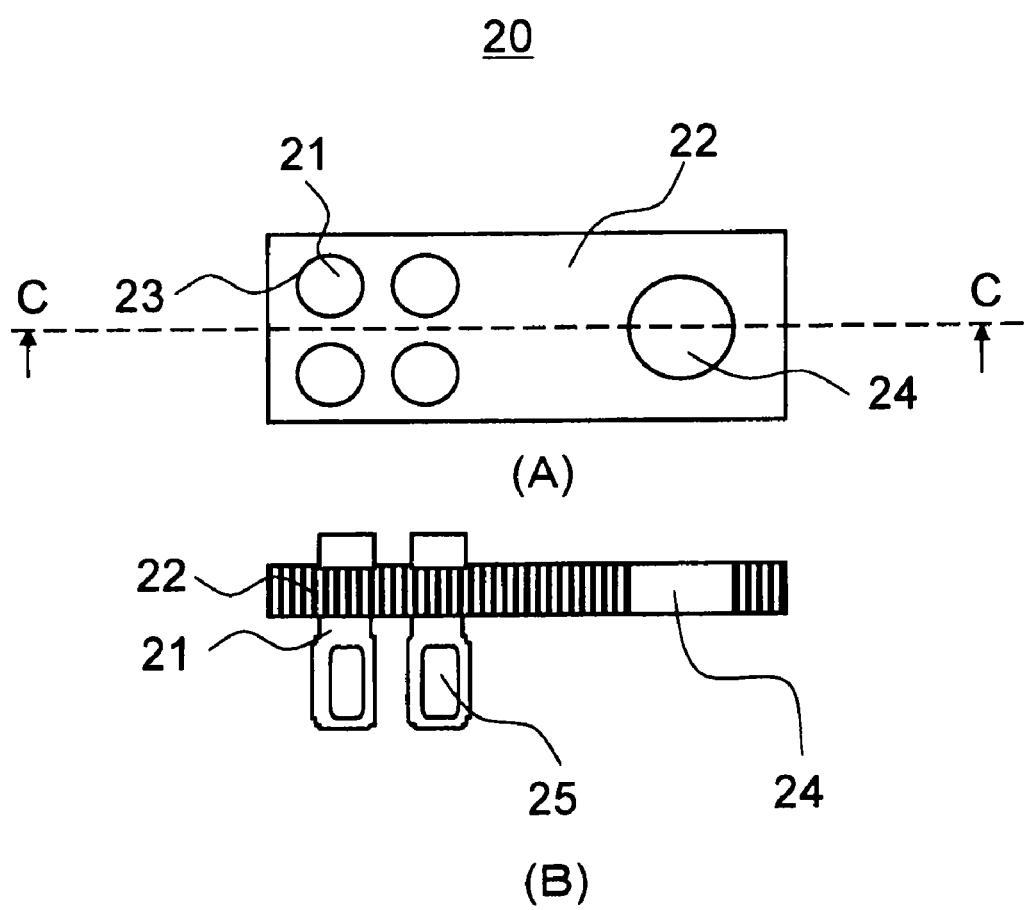
[FIG. 6]

[FIG. 7]
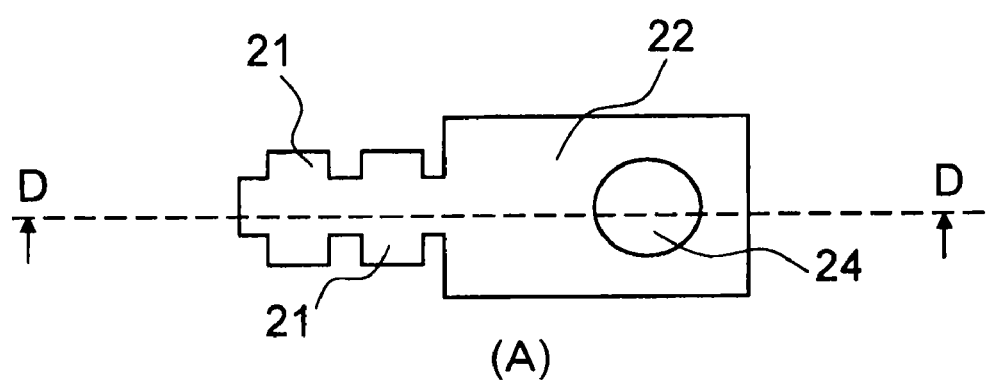
(A)
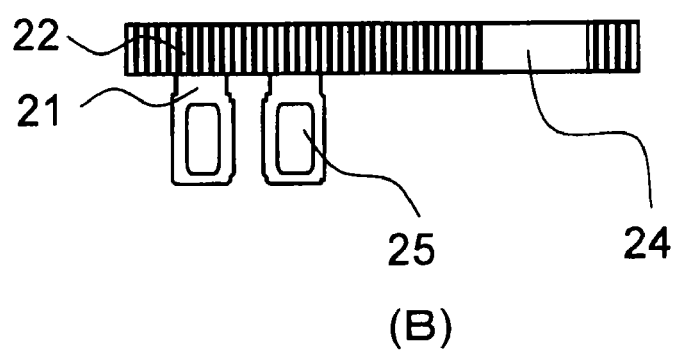
(B)

[FIG. 8]
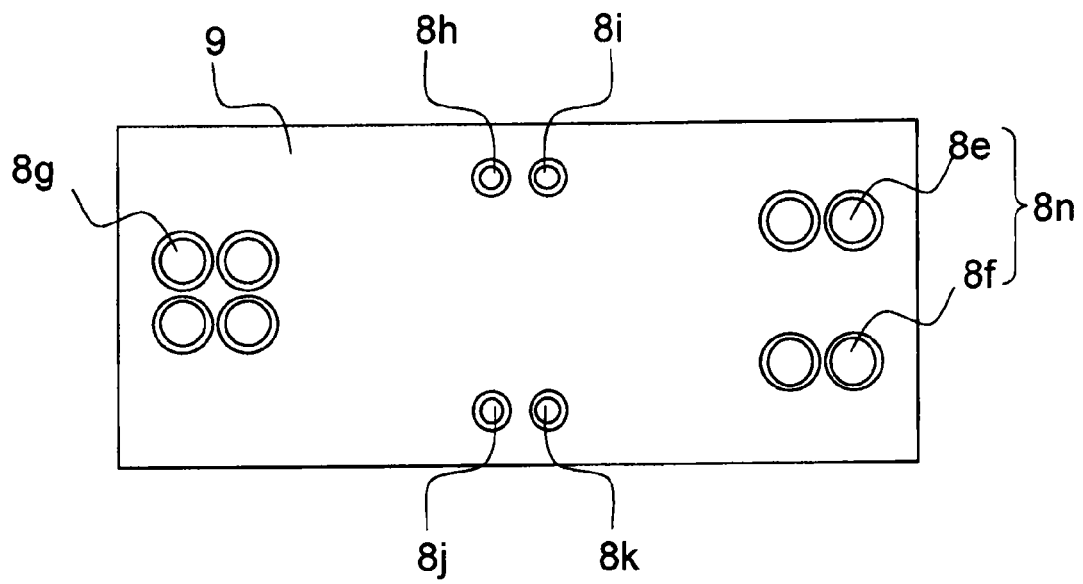

[FIG. 9]
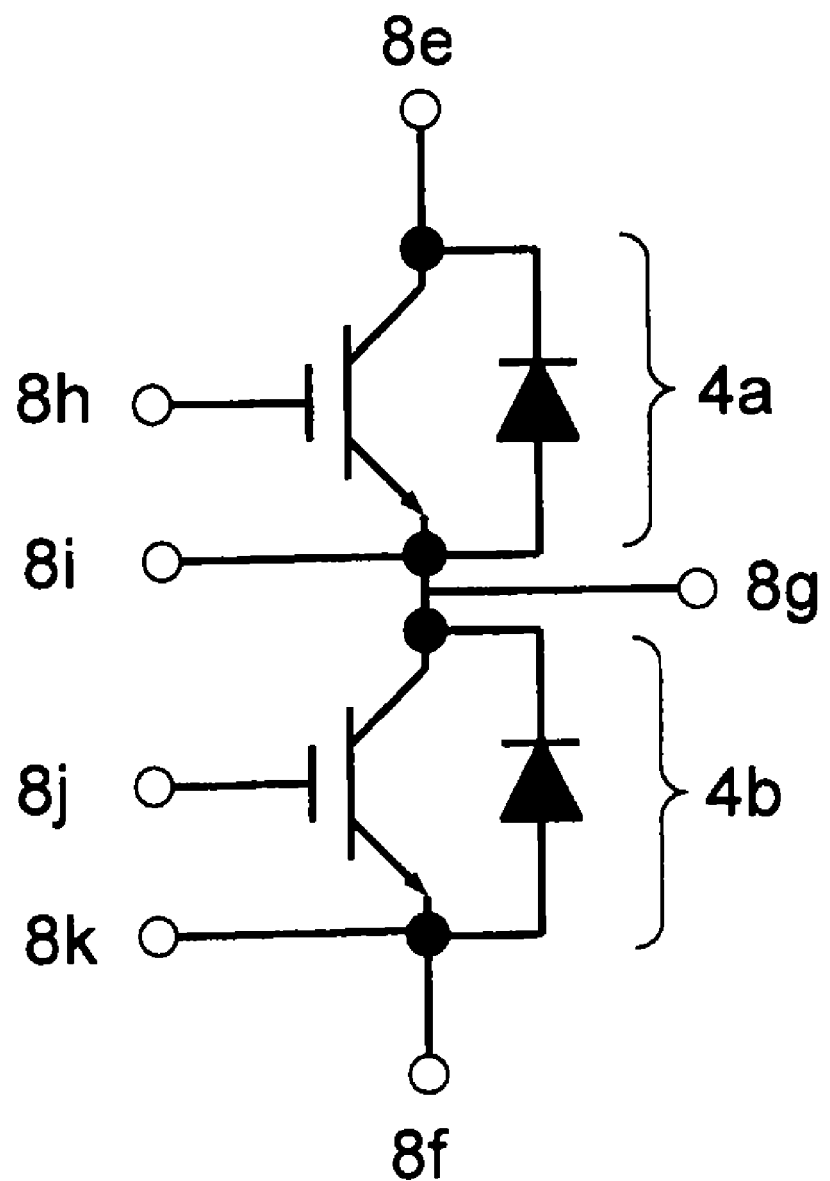

[FIG. 10]
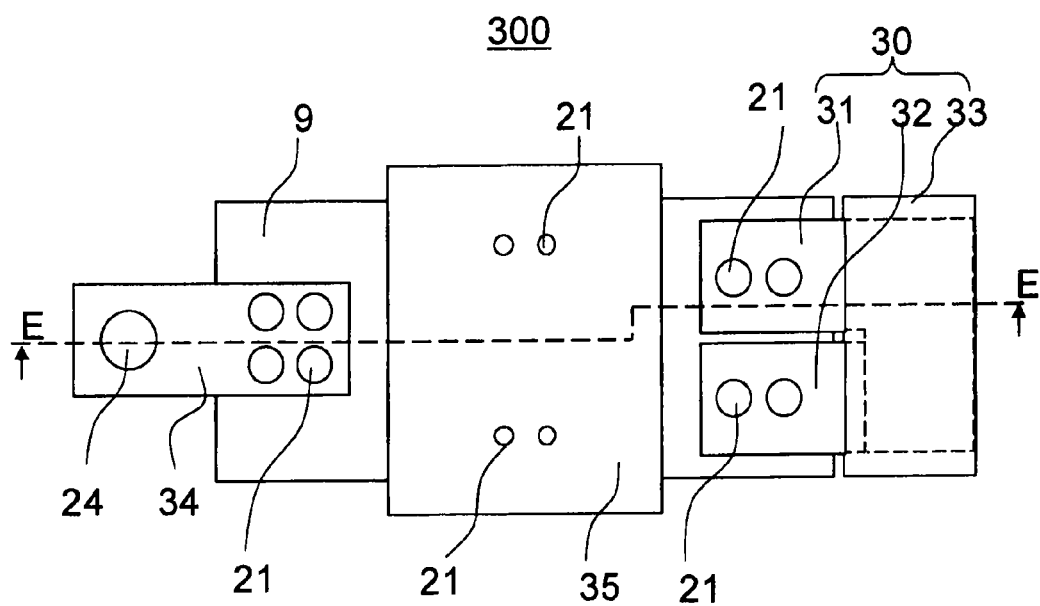

[FIG. 11]
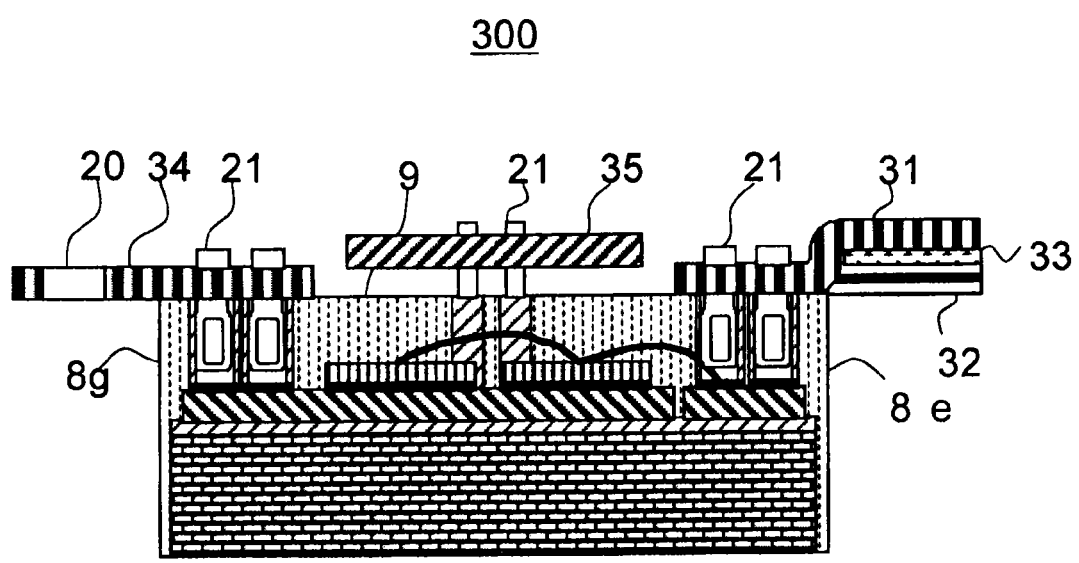

POWER SEMICONDUCTOR DEVICE

CROSS-REFERENCE TO RELATED APPLICATIONS

The present application is a continuation of U.S. application Ser. No. 12/504,225 filed Jul. 16, 2009, and is based upon and claims the benefit of priority from prior Japanese Patent Applications No. 2008-186603 filed Jul. 18, 2008, the contents of each of which are incorporated herein by reference in their entirety.

BACKGROUND OF THE INVENTION

1. Field of the Invention

The present invention relates to a resin-sealed power semiconductor device, formed by transfer molding, which is excellent in terms of productivity. The present invention particularly relates to a resin-sealed power semiconductor device, formed by transfer molding, which is small in size, realizes operation with a large current, and is highly reliable.

2. Description of the Background Art

A power semiconductor device capable of operating with a large current and a high voltage, which is able to efficiently discharge heat, which is generated by the operation of the power semiconductor device, to the outside of the power semiconductor device, is the one that is formed such that: power semiconductor elements are mounted on a substrate that includes a metal plate acting as a heat sink and a wiring pattern formed above the metal plate, the substrate including a ceramic plate interposed as an insulation layer between the wiring pattern and the metal plate; and heat-hardening resin is cast such that silicone gel is positioned between the heat-hardening resin and the substrate (see, e.g., Page 3, FIG. 1 of Japanese Laid-Open Patent Publication No. H08-316357 (hereinafter, referred to as Patent Document 1)).

However, in manufacturing of the power semiconductor device described in Patent Document 1, there are processes of, for example: bonding the external casing, which is formed of thermoplastic resin, to the metal plate; filling and curing the silicone gel; and injecting and curing the heat-hardening resin. Thus, there are a large number of manufacturing processes, causing a prolonged manufacturing time. Accordingly, there is a problem of low productivity.

A power semiconductor device which solves this problem and which is excellent in terms of productivity is the one in which: lead frames are provided on a metal plate while an insulation layer is interposed between the lead frames and the metal plate; and power semiconductor elements are mounted on the lead frames and sealed with transfer molding resin (see, e.g., Page 3, FIG. 1 of Japanese Laid-Open Patent Publication No. 2001-196495 (hereinafter, referred to as Patent Document 2)).

The power semiconductor device described in Patent Document 2, which is sealed with transfer molding resin, has a structure in which lead frames protrude, as external terminals, from the sides of the sealing resin of the transfer molding. Accordingly, there is a problem that it is difficult to reduce the size of the power semiconductor device. In addition, since a bending process is performed on the lead frames that are used as the external terminals, there is a limitation regarding the thickness thereof. For this reason, the amount of current to be applied to the external terminals cannot be increased. Thus, there is a problem that an increase in the current is limited in the power semiconductor device.

A power semiconductor device sealed with transfer molding resin, which is small in size and capable of increasing the current to be applied and solving the above problems, is the one in which: power semiconductor elements such as an IGBT and the like are mounted on a circuit pattern joined to a metal heat sink base; and main terminals and control terminals for external connection are joined to a circuit pattern surface so as to be substantially perpendicular to the circuit pattern surface, and are transfer molded.

A copper block, a cylinder having a screw hole, or a resin-molded nut, is used for a main terminal connected to a main circuit of the power semiconductor device. The main terminal that is a copper block is joined to external wiring by soldering. The main terminal that is a cylinder having a screw hole, and the main terminal in which a nut is resin molded, are connected to external wiring by bolts. Further, a female connector is used as a control terminal to be connected to a control circuit of the power semiconductor device, and is connected to external wiring by a pin-type terminal provided on a control substrate that is the external wiring.

In the power semiconductor device sealed with transfer molding resin, a bus bar to which a large current can be applied is used as the external wiring to be connected to the main terminal connected to the main circuit (see, e.g., Page 7 to 9, FIGS. 1, 5 and 10 of Japanese Laid-Open Patent Publication No. 2007-184315 (hereinafter, referred to as Patent Document 3)).

In the power semiconductor device described in Patent Document 3 which is sealed with transfer molding resin, the external wiring, which is a bus bar through which a large current can be applied to the main terminal, is fixed by thread connection or soldering. Accordingly, a substantial stress is applied to the main terminal area during the assembling of the power semiconductor device. Due to this stress, there is a problem that defects occur at the main terminal area, for example, a gap occurs at a joint surface between the outer side surface of the main terminal and the transfer molding resin, or fine cracks occur in the transfer molding resin. This causes problems of low yield, low productivity, and low reliability of the power semiconductor device. These problems are more prominent when the connection to the external wiring is formed by thread connection.

Further, since a large current is applied, even if a cable is used for external wiring to be connected to the main terminal, the cable used herein is highly rigid. Accordingly, the same problems occur.

SUMMARY OF THE INVENTION

The present invention has been made to solve the above problems. The object of the present invention is to provide a power semiconductor device sealed with transfer molding resin, which is capable of, even if external wiring capable of applying a large current is connected to a main terminal connected to a main circuit of the power semiconductor device, reducing defects that occur at the main terminal area due to the connection with the external wiring. The provided power semiconductor device is also high in yield, excellent in terms of productivity, and highly reliable.

A power semiconductor device according to the present invention includes a circuit substrate including a metal heat sink and including a high thermal conductive insulation layer joined to one surface of the metal heat sink and including wiring patterns provided on a surface of the high thermal conductive insulation layer, which surface is opposite to a surface, of the high thermal conductive insulation layer, joined to the metal heat sink; power semiconductor elements joined to the wiring patterns; cylindrical external terminal communication sections joined to the wiring patterns; and wiring means for establishing conduction between the power semiconductor elements, between the wiring patterns, and between the power semiconductor elements and the wiring patterns. The circuit substrate, the power semiconductor elements, the cylindrical external terminal communication sections, and the wiring means are all sealed with transfer molding resin. The cylindrical external terminal communication sections are joined to the wiring patterns so as to be substantially perpendicular to the wiring patterns, such that a plurality of cylindrical external terminal communication sections among the cylindrical external terminal communication sections are two-dimensionally arranged on each of wiring patterns that act as main circuits. Holes of the cylindrical external terminal communication sections, to which external terminals are insertable and connectable, are exposed at a top surface of the transfer molding resin. Since the power semiconductor device according to the present invention has the above configuration, the stress, which occurs due to the connection of the external terminals to the cylindrical external terminal communication sections, can be dispersed and reduced, and defects at the cylindrical external terminal communication sections can be prevented.

Another power semiconductor device according to the present invention includes a plurality of AC-side cylindrical external terminal communication sections that are arranged two-dimensionally on wiring patterns, a plurality of DC-side cylindrical external terminal communication sections that are arranged two-dimensionally on the wiring patterns, and power semiconductor elements electrically conductive with the plurality of AC-side cylindrical external terminal communication sections and the plurality of DC-side cylindrical external terminal communication sections. The plurality of AC-side cylindrical external terminal communication sections, the plurality of DC-side cylindrical external terminal communication sections, and the power semiconductor elements are all sealed with transfer molding resin. The AC-side and DC-side cylindrical external terminal communication sections have holes formed at a top surface of the transfer molding resin. The AC-side cylindrical external terminal communication sections are connected to an AC-side external terminal. The DC-side cylindrical external terminal communication sections are connected to a DC-side wiring substrate. The AC-side cylindrical external terminal communication sections are connected to a connection between a negative electrode of a positive-electrode-side power semiconductor element from among the power semiconductor elements and a positive electrode of a negative-electrode-side power semiconductor element from among the power semiconductor elements. A plurality of connecting pins to be connected to the AC-side cylindrical external terminal communication sections are two-dimensionally provided in a plate portion of the AC-side external terminal. The DC-side cylindrical external terminal communication sections include a plurality of positive-electrode-side cylindrical external terminal communication sections and a plurality of negative-electrode-side cylindrical external terminal communication sections. The positive-electrode-side cylindrical external terminal communication sections are connected to a positive electrode of the positive-electrode-side power semiconductor element, and the negative-electrode-side cylindrical external terminal communication sections are connected to a negative electrode of the negative-electrode-side power semiconductor element. The DC-side wiring substrate is formed by integrating a positive-electrode-side wiring board and a negative-electrode-side wiring board with an insulation layer interposed therebetween, the positive-electrode-side wiring board being connected to the positive-electrode-side cylindrical external terminal communication sections via connecting pins, and the negative-electrode-side wiring board being connected to the negative-electrode-side cylindrical external terminal communication sections via connecting pins. A plurality of connecting pins to be connected to the DC-side cylindrical external terminal communication sections are provided two-dimensionally in a plate portion of the DC-side wiring substrate formed by said integrating. Since this other power semiconductor device according to the present invention has the above configuration, the stress, which occurs due to the connection of the external terminals to the cylindrical external terminal communication sections, can be dispersed and reduced, and defects at the cylindrical external terminal communication sections can be prevented. In addition, circuit inductance can be reduced, and surge voltage that occurs when a large current supply is cut off can be suppressed.

The forgoing and other objects, features, aspects and advantages of the present invention will become more apparent from the following detailed description when read in conjunction with the accompanying drawings.

BRIEF DESCRIPTION OF THE DRAWINGS

FIG. 1 is a schematic plane view showing that transfer molding resin on a circuit substrate of a power semiconductor device according to the first embodiment of the present invention, is removed;

FIG. 2 is a schematic cross sectional view of the power semiconductor device shown in FIG. 1, which is cut along a line A-A indicated in FIG. 1 when the transfer molding resin is present on the circuit substrate;

FIG. 3 shows that the power semiconductor device according to the first embodiment of the present invention is sealed, in a mold, with transfer molding resin;

FIG. 4 is a schematic top view of a power semiconductor device according to the second embodiment of the present invention;

FIG. 5 is a schematic cross sectional view of the power semiconductor device shown in FIG. 4, which is cut along a line B-B indicated in FIG. 4;

FIG. 6A is a schematic top view showing an external terminal having four connecting pins to be connected to cylindrical external terminal communication sections of each main circuit of the power semiconductor device according to the second embodiment of the present invention;

FIG. 6B is a schematic cross-sectional view which is cut along a line C-C indicated in the schematic top view of FIG. 6A;

FIG. 7A is a schematic top view showing an external terminal having four connecting pins to be connected to cylindrical external terminal communication sections of each main circuit of a power semiconductor device according to the third embodiment of the present invention;

FIG. 7B is a schematic cross-sectional view which is cut along a line D-D indicated in the schematic top view of FIG. 7A;

FIG. 8 is a schematic top view of a main body of a power semiconductor device according to the fourth embodiment of the present invention;

FIG. 9 shows a circuit configuration of the main body of the power semiconductor device according to the fourth embodiment of the present invention;

FIG. 10 is a schematic top view of the power semiconductor device according to the fourth embodiment of the present invention, the main body of which includes external wiring to be connected to an external circuit; and FIG. 11 is a schematic cross sectional view of the power semiconductor device shown in FIG. 10, which is cut along a line E-E indicated in the schematic top view of FIG. 10.

DETAILED DESCRIPTION OF THE PREFERRED EMBODIMENTS OF THE INVENTION

First Embodiment

FIG. 1 is a schematic plane view showing that transfer molding resin on a circuit substrate of a power semiconductor device according to the first embodiment of the present invention, is removed.

FIG. 2 is a schematic cross sectional view of the power semiconductor device shown in FIG. 1, which is cut along a line A-A indicated in FIG. 1 when the transfer molding resin is present on the circuit substrate.

As shown in FIGS. 1 and 2, in a power semiconductor device 100 of the present embodiment, a metal circuit substrate is used, which is formed such that: a resin insulation layer 2 is provided on one surface of a metal heat sink 1; and wiring patterns are provided on a surface of the resin insulation layer 2, which surface is opposite to a surface, of the resin insulation layer 2, joined to the metal heat sink 1. An IGBT 4 and a diode 5 connected in antiparallel with the IGBT 4, which are power semiconductor elements, are mounted on one of the wiring patterns. These power semiconductor elements are electrically connected to the one of the wiring patterns by means of solder 6 or the like. Top surface electrodes of the IGBT 4 and the diode 5 are electrically connected to corresponding wiring patterns by the wire bonding 7 that is wiring means.

Cylindrical external terminal communication sections are joined to the wiring patterns so as to be substantially perpendicular to the wiring patterns.

To be specific, a first cylindrical external terminal communication section 8a is joined to a first wiring pattern 3a that is a main circuit electrically connected to the collector electrode of the IGBT 4 and to the anode electrode of the diode 5; a second cylindrical external terminal communication section 8b is connected to a second wiring pattern 3b that is a main circuit electrically connected to the emitter electrode of the IGBT 4 and to the cathode electrode of the diode 5; a third cylindrical external terminal communication section 8c is joined to a third wiring pattern 3C that is a control circuit electrically connected only to the gate terminal of the IGBT 4; and a fourth cylindrical external terminal communication section 8d is joined to a fourth wiring pattern 3d that is a control circuit electrically connected only to the emitter electrode of the IGBT 4.

In the power semiconductor device 100 of the present embodiment, the first cylindrical external terminal communication section 8a and the second cylindrical external terminal communication section 8b, which are connected to the wiring patterns acting as main circuits, each include multiple cylindrical external terminal communication sections joined to corresponding wiring patterns. For example, the first cylindrical external terminal communication section 8a includes four cylindrical external terminal communication sections joined to the first wiring pattern 3a, which are arranged two-dimensionally (the term "two-dimensionally" hereinafter means "so as not to all align in the same axis") such that two pairs of them form two lines in parallel; and the second cylindrical external terminal communication section 8b includes four cylindrical external terminal communication sections joined to the second wiring pattern 3b, which are arranged two-dimensionally such that two pairs of them form two lines in parallel.

Whereas, the third cylindrical external terminal communication section 8c and the fourth cylindrical external terminal communication section 8d, which are connected to the wiring patterns acting as the control circuits, each include one cylindrical external terminal communication section joined to a corresponding wiring pattern.

In the present embodiment, the first cylindrical external terminal communication section 8a and the second cylindrical external terminal communication section 8b each include four cylindrical external terminal communication sections that are two-dimensionally joined to the corresponding wiring pattern. However, the number of these cylindrical external terminal communication sections to be included is not limited to 4. The number of these cylindrical external terminal communication sections to be included may be three or more if the space for accommodating these cylindrical external terminal communication sections allows. To be specific, the number of these cylindrical external terminal communication sections to be included is preferably 3 to 12.

A structure, which is formed with: the metal heat sink 1; the resin insulation layer 2; the wiring patterns; the IGBT 4; the diode 5; the solder 6; the wire bonding 7; and the cylindrical external terminal communication sections, is sealed with transfer molding resin 9. Here, a heat dissipation surface of the metal heat sink 1, which is an opposite surface to the surface having the resin insulation layer 2 provided thereon, is not sealed with the transfer molding resin 9. Also, surfaces of the cylindrical external terminal communication sections, which are opposite to surfaces, of the cylindrical external terminal communication sections, joined to the wiring patterns, are not sealed with the transfer molding resin 9 (hereinafter, these unsealed surfaces will be referred to as top surfaces of the cylindrical external terminal communication sections). The transfer molding resin 9 is not present within the cylindrical external terminal communication sections. The above unsealed surfaces and holes of the cylindrical external terminal communication sections are exposed.

Since the power semiconductor device 100 of the present embodiment has the structure as described above, the heat dissipation from the heat dissipation surface of the metal circuit substrate is excellent. In addition, external terminals, each of which has a pin connectable, by press-in connection, to a cylindrical external terminal communication section that is a metal cylinder and each of which is capable of performing metal-to-metal joint, can be used for external wiring electrically connecting to an external circuit. In particular, the first cylindrical external terminal communication section 8a and the second cylindrical external terminal communication section 8b, which are connected to the main circuits to which a large current is applied, each include multiple cylindrical external terminal communication sections. Accordingly, an external terminal having multiple pins can be used for each of the cylindrical external terminal communication sections 8a and 8b.

A specific example of an external terminal having multiple pins is a bus bar having multiple pins.

In the present embodiment, external terminals are used for the external wiring. However, metal cables, which can be solder-bonded to the cylindrical external terminal communication sections, may be used instead. Since the cylindrical external terminal communication sections 8a and 8b connected to the main circuits each include multiple cylindrical external terminal communication sections, multiple metal cables are connected to each of the cylindrical external terminal communication sections 8a and 8b.

Thus, in the power semiconductor device 100 of the present embodiment, external terminals, which are bus bars each having multiple pins, can be used to connect the cylindrical external terminal communication sections, which are connected to the main circuits, to an external circuit. Accordingly, the stress, which is applied to the cylindrical external terminal communication sections due to the connection of the external terminals, can be dispersed and reduced.

Further, in the case of using metal cables for connecting the cylindrical external terminal communication sections, which are connected to the main circuits, to an external circuit, multiple metal cables can be used without using thick cables. Accordingly, the stress, which is applied to the cylindrical external terminal communication sections due to the connection of the metal cables, can be dispersed and reduced.

Still further, the external terminal communication sections are cylinders that do not have screw threads. Accordingly, the connection of the external terminals or metal cables to the cylindrical external terminal communication sections is not thread connection. Therefore, the stress, which occurs due to the connection of the external terminals or metal cables, is further reduced.

Thus, the stress applied to the cylindrical external terminal communication sections is reduced in the power semiconductor device 100 of the present embodiment. This eliminates defects of the cylindrical external terminal communication sections, such as, an occurrence of a gap at a joint surface between the outer side surface of a cylindrical external terminal communication section and the transfer molding resin 9, or an occurrence of fine cracks in the transfer molding resin 9. This realizes high yield and excellent productivity in manufacturing, and also realizes excellent reliability.

Further, in the power semiconductor device 100 of the present embodiment, the cylindrical external terminal communication sections 8a and 8b, which are electrically connected to the main circuits, are each connected to such external wiring as external terminals or metal cables through multiple cylindrical external terminal communication sections. As a result, large current capacity can be accommodated.

Still further, the power semiconductor device 100 of the present embodiment has a structure in which the cylindrical external terminal communication sections are disposed on the metal circuit substrate that includes the metal heat sink 1, the resin insulation layer 2 and the wiring patterns. Accordingly, the positions and the number of the cylindrical external terminal communication sections can be freely selected by only changing the wiring patterns. Thus, the degree of freedom in determining the number of external wires to be connected and in determining the positions to which the external wires are connected, is very high.

In the present embodiment, a metal having excellent thermal conductivity, for example, aluminum, aluminum alloy, copper, copper alloy, steel, steel alloy, or the like may be used for the metal heat sink 1. Alternatively, a composite material such as a composite of copper/steel-nickel alloy/copper, a composite of aluminum/steel-nickel alloy/aluminum, or the like may be used for the metal heat sink 1. In particular, in the case of using power semiconductor elements each having a high current capacity, it is preferred to use copper having excellent thermal conductivity. The thickness, length and width of the metal heat sink 1 are properly determined based on the current carrying capacity of each power semiconductor element. That is, the thickness, length and width of the metal heat sink 1 are increased in accordance with an increase in the current carrying capacity of each power semiconductor element.

In the present embodiment, used as the resin insulation layer 2 may be, for example, a resin insulation sheet containing various ceramics and inorganic powder, or a resin insulation sheet containing glass fiber. The inorganic powder contained in the resin insulation layer 2 is, for example, alumina, beryllia, boron nitride, magnesia, silica, silicon nitride, or aluminum nitride. The thickness of the resin insulation layer is, for example, 20 to 400 µm.

Further, in the present embodiment, for example, a copper foil is used for each wiring pattern, and aluminum wires are used for the wire bonding 7. The thickness of the copper foil used for each wiring pattern and the diameter of the aluminum wires used for the wire bonding 7 are also properly determined based on the current carrying capacity of each power semiconductor element.

Still further, in the present embodiment, metal cylinders are used for the cylindrical external terminal communication sections, for example. The material used for the metal cylinders is preferably a metal plated with, for example, copper, copper alloy, aluminum, or aluminum alloy, which has excellent thermal conductivity and electrical conductivity and which can be joined to the wiring patterns by soldering.

The thickness of the cylindrical external terminal communication sections is set so that the cylindrical external terminal communication sections may not be crushed due to the molding pressure of the transfer molding. The height of the cylindrical external terminal communication sections is set to such a height as to allow external terminals, which are later inserted and connected, to be connected sufficiently. Inner diameters of the cylindrical external terminal communication sections are determined based on outer diameters of inserted portions of external terminals that are later inserted and connected to the cylindrical external terminal communication sections. The inner diameters of the cylindrical external terminal communication sections are set so as to allow, at least, the external terminals to be attached to the cylindrical external terminal communication sections.

The inner diameter of a top portion of each cylindrical external terminal communication section may be set to be equal to, or greater than, the inner diameter of the central portion of said each cylindrical external terminal communication section. In this manner, the external terminals can be readily inserted into the cylindrical external terminal communication sections.

Epoxy resin filled with silica powder filler is used as the transfer molding resin 9, for example. In the transfer molding resin 9, the content percentage of the filled silica powder is determined to be the optimal amount in consideration of a thermal expansion coefficient or the like of each component used in the power semiconductor device.

For example, when copper is used for the wiring patterns and the metal heat sink 1, the amount of silica powder filling the epoxy resin is set such that the thermal expansion coefficient of the transfer molding resin 9 coincides with the thermal expansion coefficient of the copper, that is, 16 ppm/° C. In this manner, a power semiconductor device, in which a warp does not occur, can be obtained.

In order to improve heat dissipation of the transfer molding resin, it is preferred to use alumina powder as the filler, instead of silica powder.

Described next is an example of a manufacturing method of the power semiconductor device of the present embodiment.

In manufacturing of the power semiconductor device 100 of the present embodiment, for example, an epoxy resin sheet containing B-stage alumina powder is placed on a 3 mm-thick aluminum plate, and a 0.3 mm-thick copper foil is superimposed thereon. Then, the layer of: the aluminum plate; the epoxy resin sheet containing the alumina powder; and the copper foil, is heated and pressurized so as to join the aluminum plate and the copper foil via the epoxy resin sheet containing the alumina powder. Next, the wiring patterns are formed by performing etching on the copper foil.

In this manner, the metallic circuit substrate is formed, which includes: the aluminum metal heat sink; the resin insulation layer formed of epoxy resin containing alumina powder; and the copper wiring patterns.

Next, by using the solder 6, the IGBT 4 and the diode 5 that are power semiconductor elements are joined to element mounting portions provided at predetermined positions on the wiring patterns, and the cylindrical external terminal communication sections are joined to joining areas that are provided, for the cylindrical external terminal communication sections, at predetermined positions on the wiring patterns. To be specific, the IGBT 4, the diode 5 and the first cylindrical external terminal communication section 8a are joined to the first wiring pattern 3a, and the second cylindrical external terminal communication section 8b is joined to the second wiring pattern 3b. The third cylindrical external terminal communication section 8c and the fourth cylindrical external terminal communication section 8d, which are to be connected to the control circuits, are joined to the third wiring pattern 3C and the fourth wiring pattern 3d, respectively.

Then, between the wiring patterns and the IGBT 4, between the IGBT 4 and the diode 5, and between the diode 5 and the wiring patterns, positions that require conduction therebetween are connected by the aluminum wire bonding 7.

Next, the metal circuit substrate, on which the wire-bonded power semiconductor elements and the cylindrical external terminal communication sections are mounted, is set into a mold and then sealed by a transfer molding method with the transfer molding resin 9 that is of, for example, an epoxy resin type filled with silica powder. In this manner, the power semiconductor device is completed.

FIG. 3 shows that the power semiconductor device according to the first embodiment of the present invention is sealed, in a mold, with transfer molding resin.

Hereinafter, a process of sealing the power semiconductor device with the transfer molding resin will be described in detail with reference to FIG. 3.

First, the power semiconductor device on which the wire bonding process has been completed is set into a lower mold 11 on which a spot facing process has been performed such that the measurement of the spot facing substantially coincides with the height of the power semiconductor device. Next, a resin sheet 12 having no adhesion with the transfer molding resin 9 and having elasticity and having heat resistance that does not cause heat deterioration even at approximately 200° C., is adhered and integrated to an upper mold 10 by vacuuming or the like. The upper mold 10 to which the resin sheet 12 is adhered is brought into contact with the lower mold 11, and then mold clamping is performed. Subsequently, a mold cavity formed with the upper mold 10 and the lower mold 11 is filled with the transfer molding resin 9.

The resin sheet 12 to be adhered to the upper mold 10 is, for example, a fluorine-type resin sheet such as a Teflon (registered trademark) sheet.

The depth of the spot facing on the lower mold 11 is set such that the cylindrical external terminal communication sections of the power semiconductor device on which the wire bonding process has been completed, slightly dent into the resin sheet 12. The depth of the spot facing on the lower mold 11 substantially depends on the thickness of the resin sheet 12 to be used. Accordingly, for example, if the fluorine-type resin sheet 12 that is 200 μm thick is used, the height, from the heat dissipation surface of the metal heat sink 1, of the top surfaces of the cylindrical external terminal communication sections may be formed with a tolerance of approximately 100 μm.

Since the power semiconductor device is transfer molded in the above manner, in the power semiconductor device 100 of the present embodiment, the transfer molding resin 9 is prevented from reaching the heat dissipation surface of the metal circuit substrate and the top surfaces of the cylindrical external terminal communication sections, and from entering the holes of the cylindrical external terminal communication sections. Also, the heat dissipation surface of the metal circuit substrate, the top surfaces of the cylindrical external terminal communication sections, and the inner surfaces of the holes, are exposed.

Other than the above-described first method, there are the following second to fourth methods, which are not shown, for performing transfer molding on the power semiconductor device such that the heat dissipation surface of the metal circuit substrate and the top surfaces and the inner surfaces of the cylindrical external terminal communication sections are exposed.

The second method requires strict management with respect to, for example: the height of the components used in the power semiconductor device and the height of the soldering (precision of a few μm is required); the tolerance of the materials; and the processes. Nonetheless, this method further improves the precision of the height, from the heat dissipation surface of the metal circuit substrate, of the top surfaces of the cylindrical external terminal communication sections.

In this manner, the transfer molding resin 9 can be prevented from reaching the heat dissipation surface of the metal circuit substrate and the top surfaces of the cylindrical external terminal communication sections, and from entering the holes of the cylindrical external terminal communication sections.

In the third method, elastic materials are partially provided on: a surface of the lower mold 11, the surface contacting the metal heat sink 1; and a surface of the upper mold 10, the surface contacting the cylindrical external terminal communication sections. In this method, operations, such as attaching or detaching these elastic materials, are complicated, and every time the size of the metallic circuit substrate or the positions of the cylindrical external terminal communication sections are changed, the elastic materials to be provided need redesigning.

Still, in this manner, the transfer molding resin 9 can be prevented from reaching the heat dissipation surface of the metal circuit substrate and the top surfaces of the cylindrical external terminal communication sections, and from entering the holes of the cylindrical external terminal communication sections.

In the fourth method, the holes of the cylindrical external terminal communication sections are filled, in advance, with a filling material that has no adhesion with the transfer molding resin 9, and the filling material is removed after the transfer molding is performed. In the fourth method, the deeper the depth of the cylindrical external terminal communication sections, the more complex is the means required for removing the filling material from the cylindrical external terminal communication sections.

Still, in this manner, the transfer molding resin 9 can be prevented from reaching the heat dissipation surface of the metal circuit substrate and the top surfaces of the cylindrical external terminal communication sections, and from entering the holes of the cylindrical external terminal communication sections. In particular, the transfer molding resin 9 is readily prevented from entering the holes of the cylindrical external terminal communication sections.

Particularly, the first transfer molding method is able to readily prevent, even with a low precision of the height of the power semiconductor device, the transfer molding resin 9 from reaching the heat dissipation surface of the metal circuit substrate and the top surfaces of the cylindrical external terminal communication sections, and from entering the holes of the cylindrical external terminal communication sections.

Further, automatic replacement of the resin sheet 12 provided on the upper mold 10 is possible, and a single mold can accommodate any variation of the size of the metal circuit substrate and the positions of the cylindrical external terminal communication sections. This realizes excellent mass productivity and reduction in the manufacturing cost of the power semiconductor device.

In the present embodiment, the IGBT 4 and the diode 5 are used as power semiconductor elements. However, the power semiconductor elements are not limited thereto. For example, a MOSFET, Schottky diode or the like may be used as a power semiconductor element. In the case of using a MOSFET, it is not necessary to connect the diode in antiparallel with the MOSFET. Used as a material of the power semiconductor elements may be not only general silicon, but also wide band gap semiconductor such as silicon carbide (SiC).

Further, in the present embodiment, the wire bonding 7 is used to connect the power semiconductor elements and to connect the power semiconductor elements and the corresponding wiring pattern. That is, the wire bonding 7 is used as wiring means. However, the wiring means is not limited thereto.

Still further, although a metal circuit substrate is used in the present embodiment, a ceramic substrate may be used instead. For example, the ceramic substrate includes: a ceramic plate that is a high thermal conductive insulation layer; copper wiring patterns provided on one surface of the ceramic plate; and a copper metal heat sink provided on the other surface of the ceramic plate.

Second Embodiment

FIG. 4 is a schematic top view of a power semiconductor device according to the second embodiment of the present invention.

FIG. 5 is a schematic cross sectional view of the power semiconductor device shown in FIG. 4, which is cut along a line B-B indicated in FIG. 4.

In the present embodiment, a surface of the transfer molding resin 9, at which holes of cylindrical external terminal communication sections of the power semiconductor device are present, is referred to as a top surface.

As shown in FIGS. 4 and 5, a power semiconductor device 200 of the present embodiment is the same as the power semiconductor device 100 of the first embodiment except that in the present embodiment, external terminals 20 each provided with connecting pins 21 are connected to the cylindrical external terminal communication sections of the power semiconductor device 100 of the first embodiment. One external terminal connecting pin 21 is inserted into the cylindrical external terminal communication section of each control circuit, and a plurality of external terminal connecting pins 21 are inserted into the cylindrical external terminal communication sections of each main circuit.

FIG. 6A is a schematic top view showing an external terminal 20 having four connecting pins to be connected to the cylindrical external terminal communication sections of each main circuit of the power semiconductor device according to the second embodiment of the present invention. FIG. 6B is a schematic cross-sectional view which is cut along a line C-C indicated in the schematic top view of FIG. 6A.

In the present embodiment, a surface of a plate portion 22 of the external terminal 20, which is the opposite surface to a surface having connecting pins 21 protruding downward therefrom, is referred to as a top surface.

As shown in FIGS. 6A and 6B, the external terminal 20, which is connected to each of the cylindrical external terminal communication sections 8a and 8b of the main circuits, includes the plate portion 22 and the connecting pins 21. Four connecting pins 21, which are arranged two-dimensionally such that two pairs of them form two lines in parallel, are provided in the plate portion 22 so as to be substantially perpendicular to a plate surface of the plate portion 22.

Relay communication holes 23, to which the connecting pins 21 are connected, are provided on one side of the plate portion 22. An external circuit connection hole 24, which is a through hole for connecting the external terminal 20 to an external circuit via a screw or the like, is provided on the other side of the plate portion 22.

The connecting pins 21 are provided in the plate portion 22 so as to be insertable into a corresponding one of the cylindrical external terminal communication sections 8a and 8b of the main circuits. The connecting pins 21 are connected to the corresponding cylindrical external terminal communication sections by press fitting that is press-in connection. For this reason, the connecting pins 21 are each provided with a hole 25 that provides a resilient characteristic (hereinafter, referred to as a resilient characteristic providing hole).

In the present embodiment, the external terminal 20 includes the connecting pins 21 and the plate portion 22, which are separate components. The external terminal 20 is formed by connecting the connecting pins 21 to the relay communication holes 23 of the plate portion 22. For this reason, the connecting pins 21 can be formed of a material having a resilient characteristic, and the plate portion 22 can be formed of a material having high electrical conductivity. For example, the material having a resilient characteristic is phosphor bronze, and the material having a high electrical conductivity is copper.

That is, the material having a resilient characteristic such as phosphor bronze, whose electrical conductivity is less than copper or the like, is used only for the connecting pins 21. As a result, the resistance of the external terminals to be connected to the main circuits can be reduced.

As for the power semiconductor device 200 of the present embodiment, a method for joining the external terminals 20 to the cylindrical external terminal communication sections 8a and 8b of the main circuits, is the one in which the connecting pins 21 are attached to the plate portions 22 in advance and then the connecting pins 21 are inserted into the cylindrical external terminal communication sections, or the one in which the connecting pins 21 are inserted into the cylindrical external terminal communication sections in advance and then the connecting pins 21 are connected to the plate portions 22.

In the power semiconductor device 200 of the present embodiment, the external terminals 20, in each of which multiple connecting pins 21 are arranged two-dimensionally in the single plate portion 22, are connected to the cylindrical external terminal communication sections 8a and 8b joined to the respective main circuits.

Accordingly, even if the external terminals 20 to be used for the power semiconductor device 200 of the present embodiment are large terminals to which a large current can be applied, the stress, which occurs due to the joining of the external terminals 20 to the cylindrical external terminal communication sections 8a and 8b of the main circuits, is dispersed and reduced. This prevents defects of the cylindrical external terminal communication sections due to the stress, such as, an occurrence of a gap at a joint surface between the outer side surface of a cylindrical external terminal communication section and the transfer molding resin 9, or an occurrence of fine cracks in the transfer molding resin 9. Consequently, high yield and excellent productivity in manufacturing, and also excellent reliability, can be realized.

The external terminal communication sections are cylindrical external terminal communication sections that do not have screw threads. Accordingly, the connection of the external terminals to the cylindrical external terminal communication sections is not thread connection. As a result, the stress that occurs due to the connection of the external terminals is further reduced.

In the present embodiment, the external terminals 20, in each of which four connecting pins 21 are two-dimensionally arranged in the single plate portion 22, are used. However, the number of cylindrical external terminal communication sections included in each of the cylindrical external terminal communication sections 8a and 8b may be more than four, and external terminals, in each of which more than four connecting pins are two-dimensionally arranged in the single plate portion, may be used.

In the case where the cylindrical external terminal communication sections 8a and 8b each include three cylindrical external terminal communication sections, these three cylindrical external terminal communication sections may be arranged at the vertexes of a triangle, respectively, and also, in each external terminal, three connecting pins may be arranged, in the single plate portion, at the vertexes of a triangle, respectively.

Further, in the present embodiment, the material having a resilient characteristic is used for the connecting pins 21, and the external terminals 20 are connected to the cylindrical external terminal communication sections by press fitting. However, a material having high electrical conductivity may be used for the connecting pins 21, and the cylindrical external terminal communication sections and the external terminals 20 may be joined by soldering. In this case, the resistance of the external terminals can be further reduced.

Third Embodiment

FIG. 7A is a schematic top view showing an external terminal 26 having four connecting pins to be connected to the cylindrical external terminal communication sections of each main circuit of a power semiconductor device according to the third embodiment of the present invention. FIG. 7B is a schematic cross-sectional view which is cut along a line D-D indicated in the schematic top view of FIG. 7A.

Here, a surface of the plate portion 22 of the external terminal 26, which is the opposite surface to a surface having connecting pins 21 protruding therefrom, is referred to as a top surface.

The power semiconductor device of the present embodiment (not shown) is the same as the power semiconductor device 200 of the second embodiment except that external terminals 26, each of which has four connecting pins 21 and in each of which the plate portion 22 and the connecting pins 21 are integrated, are used.

As shown in FIGS. 7A and 7B, in each external terminal 26 of the present embodiment, the connecting pins 21 are formed by performing a bending process or the like on a metal plate of the plate portion 22. Also, similarly to the external terminals 20 of the second embodiment, the plate portion 22 of each external terminal 26 is provided with the external circuit connection hole 24, and the connecting pins 21 are each provided with the resilient characteristic providing hole 25.

The present embodiment provides the same effect as that of the second embodiment. In addition, the external terminals 26 have high productivity since, in each external terminal 26, the connecting pins 21 are formed by performing the bending process on the metal plate of the plate portion 22.

In the present embodiment, when the external terminals 26 are each formed of a single metal plate having a resilient characteristic, the external terminals 26 can be connected to the cylindrical external terminal communication sections by press fitting although the resistance of the external terminals becomes relatively high. When the external terminals 26 are each formed of a single metal plate having high electrical conductivity, the external terminals 26 can be connected to the cylindrical external terminal communication sections by soldering, and the resistance of the external terminals 26 can be further reduced.

Fourth Embodiment

FIG. 8 is a schematic top view of a main body of a power semiconductor device according to the fourth embodiment of the present invention.

FIG. 9 shows a circuit configuration of the main body of the power semiconductor device according to the fourth embodiment of the present invention.

A power semiconductor device main body 50 of the present embodiment is a result of sealing power semiconductor elements with the transfer molding resin 9. Here, a surface of the transfer molding resin 9, at which holes of cylindrical external terminal communication sections are present, is referred to as a top surface.

As shown in FIGS. 8 and 9, the power semiconductor device main body 50 includes: a plurality of DC-side positive-electrode-side cylindrical external terminal communication sections 8e electrically connected to the positive electrode of a positive-electrode-side power semiconductor element 4a; a plurality of DC-side negative-electrode-side cylindrical external terminal communication sections 8f electrically connected to the negative electrode of a negative-electrode-side power semiconductor element 4b; a plurality of AC-side cylindrical external terminal communication sections 8g electrically connected to a connection between the negative electrode of the positive-electrode-side power semiconductor element 4a and the positive electrode of the negative-electrode-side power semiconductor element 4b; a pair of control-electrode-use cylindrical external terminal communication sections 8h and 8i electrically connected to the control electrode of the positive-electrode-side power semiconductor element 4a; and a pair of control-electrode-use cylindrical external terminal communication sections 8j and 8k electrically connected to the control electrode of the negative-electrode-side power semiconductor element 4b.

The positive-electrode-side cylindrical external terminal communication sections 8e and the negative-electrode-side cylindrical external terminal communication sections 8f constitute a DC-side cylindrical external terminal communication section 8n.

Further, the plurality of AC-side cylindrical external terminal communication sections 8g are arranged two-dimensionally, and holes of the AC-side cylindrical external terminal communication sections 8g are present at the top surface of the transfer molding resin 9.

There are two DC-side positive-electrode-side cylindrical external terminal communication sections 8e and two DC-side negative-electrode-side cylindrical external terminal communication sections 8f. The DC-side cylindrical external terminal communication sections 8n including the both is arranged two-dimensionally. Holes of the DC-side cylindrical external terminal communication sections 8n are also present at the top surface of the transfer molding resin 9.

The power semiconductor device main body 50 according to the present embodiment is a fundamental form of a power electronics apparatus such as an inverter.

FIG. 10 is a schematic top view of the power semiconductor device according to the fourth embodiment of the present invention, the main body of which includes external wiring to be connected to an external circuit.

FIG. 11 is a schematic cross sectional view of the power semiconductor device shown in FIG. 10, which is cut along a line E-E indicated in the schematic top view of FIG. 10.

As shown in FIGS. 10 and 11, the power semiconductor device main body 50 of a power semiconductor device 300 of the present embodiment is provided with external wiring to be connected to an external circuit. To be specific, the power semiconductor device main body 50 is provided with: a positive-electrode-side wiring board 31 and a negative-electrode-side wiring board 32, with which a DC-side wiring substrate 30 is formed; an AC-side external terminal 34; and a control substrate 35.

Through the connecting pins 21, the positive-electrode-side wiring board 31 is connected to the positive-electrode-side cylindrical external terminal communication sections 8e; the negative-electrode-side wiring board 32 is connected to the negative-electrode-side cylindrical external terminal communication sections 8f; the AC-side external terminal 34 is connected to the AC-side cylindrical external terminal communication sections 8g; and the control substrate 35 is connected to the control-electrode-use cylindrical external terminal communication sections 8h, 8i, 8j and 8k.

The DC-side wiring substrate 30 is formed by integrating the positive-electrode-side wiring board 31 and the negative-electrode-side wiring board 32 with an insulation layer 33 interposed therebetween.

A plate portion of the AC-side external terminal 34 is provided with the external circuit connection hole 24 for connecting the AC-side external terminal 34 to an external circuit.

The control substrate 35 includes a drive circuit for the positive-electrode-side power semiconductor element 4a and the negative-electrode-side power semiconductor element 4b.

Here, connection of the positive-electrode-side wiring board 31 and the negative-electrode-side wiring board 32, which are plate portions of the DC-side wiring substrate 30, to the connecting pins 21, and connection of the plate portion of the AC-side external terminal 34 to the connecting pins 21, are formed by soldering or brazing, for example.

In the present embodiment, the AC-side external terminal 34 has four connecting pins 21 which are two-dimensionally arranged. The AC-side external terminal 34 is connected to the AC-side cylindrical external terminal communication sections 8g via these connecting pins 21. Therefore, similarly to the power semiconductor device of the second embodiment, by connecting the AC-side external terminal 34 to the AC-side cylindrical external terminal communication sections 8g, the stress applied to the AC-side cylindrical external terminal communication sections 8g can be dispersed and reduced, whereby defects of the AC-side cylindrical external terminal communication sections 8g can be prevented.

The AC-side cylindrical external terminal communication sections 8g and the connecting pins 21 are connected by, for example, press-in connection such as press fitting, or soldering.

The positive-electrode-side wiring board 31 is connected to the positive-electrode-side cylindrical external terminal communication sections 8e via the two connecting pins 21 that are aligned. Also, the negative-electrode-side wiring board 32 is connected to the negative-electrode-side cylindrical external terminal communication sections 8f via the two connecting pins 21 that are aligned. The DC-side wiring substrate 30 is formed by integrating the positive-electrode-side wiring board 31 and the negative-electrode-side wiring board 32 via the insulation layer 33.

In other words, four connecting pins 21, which are the two connecting pins 21 provided in the positive-electrode-side wiring board 31 and the two connecting pins 21 provided in the negative-electrode-side wiring board 32, are two-dimensionally arranged in the DC-side wiring substrate 30. The DC-side wiring substrate 30 is connected to the DC-side cylindrical external terminal communication sections 8n via these four connecting pins 21 that are two-dimensionally arranged. With this structure, similarly to the power semiconductor device of the second embodiment, by connecting the DC-side wiring substrate 30 to the DC-side cylindrical external terminal communication sections 8n, the stress applied to the DC-side cylindrical external terminal communication sections 8n can be dispersed and reduced, and defects of the DC-side cylindrical external terminal communication sections 8n can be prevented.

Thus, since the power semiconductor device 300 of the present embodiment prevents defects from occurring at the cylindrical external terminal communication sections, the manufacturing yield thereof is high, and the productivity and reliability thereof are excellent.

Further, in the present embodiment, the positive-electrode-side wiring board 31 and the negative-electrode-side wiring board 32 for forming the DC-side wiring substrate 30 are connected to the DC-side cylindrical external terminal communication sections 8n via the connecting pins 21. For this connection, press-in connection such as press fitting, soldering, or the like is used. The connection by these methods reduces, as compared to thread connection, the inductance of a circuit connecting the DC-side wiring substrate 30, which is a DC-side circuit, to the positive-electrode-side power semiconductor element 4a and the negative-electrode-side power semiconductor element 4b.

For this reason, a surge voltage, which occurs due to wiring inductance when a large current applied to the power semiconductor device is cut off, can be reduced.

In the present embodiment, the plate portions of the AC-side external terminal 34 and the DC-side wiring substrate 30 are separate components from the connecting pins 21 thereof. Accordingly, the plate portions may be formed of metal having high electrical conductivity and the connecting pins may be formed of metal having a resilient characteristic, or the plate portions and the connecting pins may be both formed of metal having high electrical conductivity.

Alternatively, each plate portion and the connecting pins 21 thereof may be integrally formed of a single piece of metal.

In the present embodiment, the configuration of a circuit to be set in a mold is not limited to the one shown in FIG. 9. For example, three circuits each having the configuration shown in FIG. 9 may be connected in parallel at the positive electrode side and at the negative electrode side, i.e., a three-phase inverter configuration.

The power semiconductor device according to the present invention is small in size, capable of operating with a large current, and excellent in terms of productivity and reliability, and therefore effectively utilized in electric appliances that are required to be high-performance and low-cost.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor device comprising:
   a plurality of AC-side cylindrical external terminal communication sections that are arranged two-dimensionally on wiring patterns;
   a plurality of DC-side cylindrical external terminal communication sections that are arranged two-dimensionally on the wiring patterns; and
   power semiconductor elements electrically conductive with the plurality of AC-side cylindrical external terminal communication sections and the plurality of DC-side cylindrical external terminal communication sections,
   the plurality of AC-side cylindrical external terminal communication sections, the plurality of DC-side cylindrical external terminal communication sections, and the power semiconductor elements, all being sealed with transfer molding resin,
   the AC-side and DC-side cylindrical external terminal communication sections having holes formed at a top surface of the transfer molding resin, and
   the AC-side cylindrical external terminal communication sections being connected to an AC-side external terminal,
   the DC-side cylindrical external terminal communication sections being connected to a DC-side wiring substrate, wherein
   the AC-side cylindrical external terminal communication sections are connected to a connection between a negative electrode of a positive-electrode-side power semiconductor element from among the power semiconductor elements and a positive electrode of a negative-electrode-side power semiconductor element from among the power semiconductor elements,
   a plurality of connecting pins to be connected to the AC-side cylindrical external terminal communication sections are two-dimensionally provided in a plate portion of the AC-side external terminal;
   the DC-side cylindrical external terminal communication sections include a plurality of positive-electrode-side cylindrical external terminal communication sections and a plurality of negative-electrode-side cylindrical external terminal communication sections,
   the positive-electrode-side cylindrical external terminal communication sections are connected to a positive electrode of the positive-electrode-side power semiconductor element, and the negative-electrode-side cylindrical external terminal communication sections are connected to a negative electrode of the negative-electrode-side power semiconductor element,
   the DC-side wiring substrate is formed by integrating a positive-electrode-side wiring board and a negative-electrode-side wiring board with an insulation layer interposed therebetween, the positive-electrode-side wiring board being connected to the positive-electrode-side cylindrical external terminal communication sections via connecting pins, and the negative-electrode-side wiring board being connected to the negative-electrode-side cylindrical external terminal communication sections via connecting pins, and
   a plurality of connecting pins to be connected to the DC-side cylindrical external terminal communication sections are provided two-dimensionally in a plate portion of the DC-side wiring substrate formed by said integrating.

2. The power semiconductor device according to claim 1, wherein at least connection between the connecting pins of the positive-electrode-side wiring board and the positive-electrode-side cylindrical external terminal communication sections, and connection between the connecting pins of the negative-electrode-side wiring board and the negative-electrode-side cylindrical external terminal communication sections, are formed by either one of press-in connection and soldering.

3. The power semiconductor device according to claim 1, wherein
   the plate portions of the AC-side external terminal and the DC-side wiring substrate are separate components from the connecting pins thereof,
   the plate portions are each formed of metal, and
   the connecting pins are each formed of metal having a resilient characteristic.

4. The power semiconductor device according to claim 1, wherein
   the plate portions of the AC-side external terminal and the DC-side wiring substrate are separate components from the connecting pins thereof, and
   the plate portions and the connecting pins are each formed of metal.

5. The power semiconductor device according to claim 1, wherein in each of the AC-side external terminal and the DC-side wiring substrate, the plate portion and the connecting pins are integrally formed of a single piece of metal.

* * * * *